United States Patent [19]

Shimbo et al.

[11] Patent Number: 4,671,846
[45] Date of Patent: Jun. 9, 1987

[54] METHOD OF BONDING CRYSTALLINE SILICON BODIES

[75] Inventors: Masaru Shimbo; Kiyoshi Fukuda, both of Yokohama, Japan

[73] Assignee: Kabushiki Kaisha Toshiba, Kawasaki, Japan

[21] Appl. No.: 641,207

[22] Filed: Aug. 16, 1984

[30] Foreign Application Priority Data

Aug. 31, 1983 [JP] Japan .................. 58-159276

[51] Int. Cl.$^4$ .................. H01L 21/306
[52] U.S. Cl. .................. 156/629; 29/576 J; 29/589; 134/3; 357/49
[58] Field of Search .................. 156/273.9, 308.2, 629; 204/16; 357/49; 338/2; 29/576 E, 576 W, 589, 576 J, 577 R; 65/40; 134/3, 22.19

[56] References Cited

U.S. PATENT DOCUMENTS

| | | | |
|---|---|---|---|
| 3,239,908 | 3/1966 | Nakamura | 29/577 R |
| 3,397,278 | 8/1968 | Pomerantz | 357/49 X |
| 4,121,334 | 10/1978 | Wallis | 29/589 |
| 4,463,336 | 7/1984 | Black et al. | 338/2 X |
| 4,501,060 | 2/1985 | Frye et al. | 156/273.9 X |

FOREIGN PATENT DOCUMENTS

| | | |
|---|---|---|
| 49-26455 | 7/1974 | Japan . |
| 50-13155 | 5/1975 | Japan . |
| 54-51488 | 4/1979 | Japan . |

OTHER PUBLICATIONS

Brooks et al., "Low Temperature Electrostatic Silicon-to-Silicon Seals . . . ", J. Electrochem. Soc., vol. 119, No. 4, Apr. 1972, pp. 545-546.

IEEE Trans. Electron Dev., vol. ED-16, No. 10, Oct. 1969, E. R. Peake, A. R. Zias, J. V. Egan: "Solid-State Digital Pressure Transducer".

IEEE Spectrum, vol. 18, No. 9, Sep. 1981, pp. 33-39, IEEE, New York, US; P. W. Barth: "Silicon Sensors Meet Integrated Circuits".

Primary Examiner—Donald Czaja
Assistant Examiner—Ramon R. Hoch
Attorney, Agent, or Firm—Oblon, Fisher, Spivak, McClelland & Maier

[57] ABSTRACT

A method of bonding two single-crystal silicon bodies comprises the steps of: (i) mirror-polishing the contact surfaces of the bodies to reduce the surface roughness to 500A or less; (ii) removing contaminant from the mirror-polished surfaces; and (iii) bringing the surfaces into mutual contact so that substantially no foreign substance enter the gap between these surfaces.

8 Claims, 2 Drawing Figures

F I G. 1
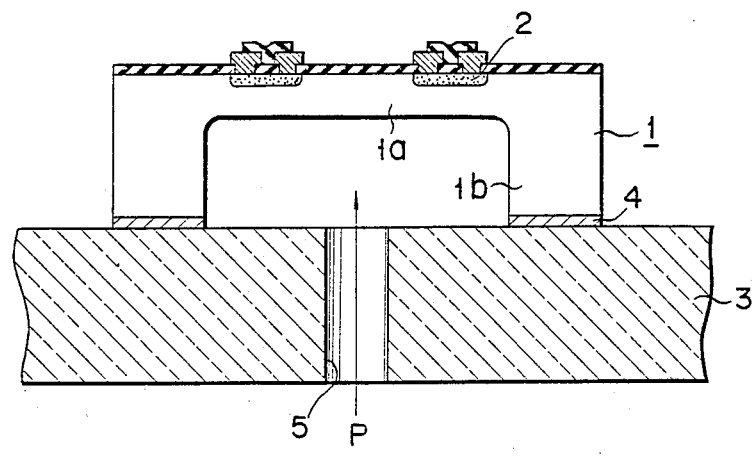
F I G. 2
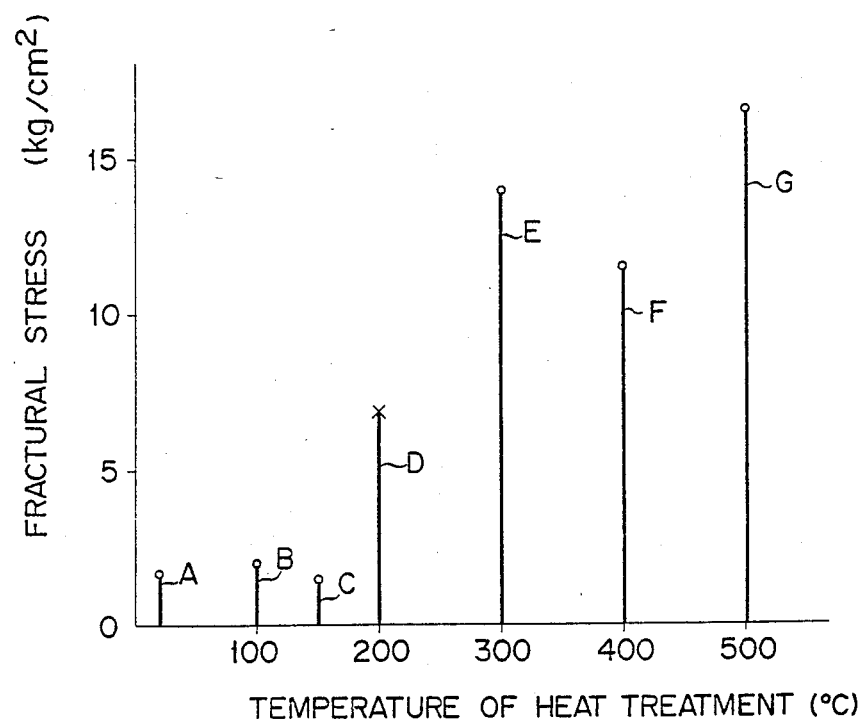

METHOD OF BONDING CRYSTALLINE SILICON BODIES

BACKGROUND OF THE INVENTION

Field of the Invention

The present invention relates to a novel, practical method of bonding two crystalline silicon bodies without using an adhesive agent.

Theoretically, two solid bodies may be strongly bonded by the chemical attracting force between the atoms or by the cohesive force between the molecules when their surfaces are placed as close to each other as a gap which is equal to the gap between the atoms forming them. Practically, however, such bonding does not occur even if the bodies are placed so close. The reasons may be:

(1) Various gases are adsorbed in the surface regions of the bodies, and the surfaces thereof are in an inert state.

(2) The surfaces of the bodies are uneven. If they are brought into mutual contact, only some atoms of the surface regions contact and the cohesive force between them is insufficient to hold the bodies together.

(3) Usually, scales, dirt, foreign particles, etc., are on the surfaces of the bodies and prevent the direct contact of the bodies.

Hence, in order to bond the bodies without using an adhesive agent, gases should be removed from the surface regions of the bodies, the contact surfaces of the bodies must have a smoothness in the order of the atom size, and the scales, dirt, etc., must be removed from the surfaces of the bodies.

The method most commonly used to bond solid bodies is to use an organic or inorganic bonding agent. During the process, the bonding agent may either be liquid or take a similar state. As long as it remains liquid or in a similar state, it may flow into concaves in the surface of either body and adsorbed into the surface region, expelling the gases therefrom, or it may react with the solid body, thereby firmly bonding the solid bodies.

A method of bonding solid bodies is known which uses no bonding agent and in which two solid bodies of the same material or different materials fuse together. More specifically, the solid bodies are heated, thereby causing creep or fluidizing of their surface regions, whereby the fluidized material fills the concaves in the surfaces, lessens the strain energy at the contacting surfaces, and dissolves and diffuses the foreign matter existing at the interface between the bodies. Hence, the bonding energy at the interface increases.

Neither the method using a bonding agent nor the method of fusing the bodies can be used in some cases. One of these cases is the production of a semiconductor pressure transducer. How this device is manufactured will be described.

As shown in FIG. 1, a semiconductor pressure transducer comprises a single-crystal silicon plate 1, a piezoelectric resistance gauge 2 formed on the upper surface of the plate 1, and a glass substrate 3. The plate 1 consists of a circular thin diaphram portion 1a on which the gauge 2 is formed and a thick ring portion 1b whose lower end is bonded to the upper surface of the substrate 3 by a layer 4 of bonding agent. The glass plate 3 has a central through hole 5. Air pressure 9 is transmitted through this hole 5, thereby deforming the diaphragm portion 1a. As the portion 1a is deformed, the electrical resistance of the gauge 2 changes. This change is detected to determine pressure P.

In the case of the pressure transducer, it is desired that the peizoelectric resistance gauge 2 be very sensitive only to pressure P. In the transducer, however, there is a thermal expansion difference between the plate 1 and substrate 3, which are made of materials having different thermal expansion coefficients. The stress created by this thermal expansion difference acts on the the diaphragm portion 1a, making it impossible for the transducer to correctly detect pressure P. To avoid an inaccurate detection of the pressure, it has been proposed that the substrate be made of a single-crystal silicon, the same material of the plate 1.

Even if the substrate 3 is made of single-crystal silicon, the bonding layer 4, made of Au-Si eutectic alloy, low melting-point solder glass or the like, has a residual stress which also adversely influences the detection of pressure. Accordingly, it is desired that the plate 1 be bonded to the substrate 3 without using a bonding agent.

A method which uses no bonding agent has been invented. This method uses a substrate of borosilicate glass whose thermal expansion coefficient is similar to that of silicon. That surface of the substrate which contacts a single-crystal silicon plate 1 is heated to a glass transition point or a higher temperature. Alternatively, an electric field is applied to the substrate, thus heating the same. When this method is applied in assembling a device which will be used under a high hydrostatic pressure, such as a semiconductor pressure transducer, strain or stress will be created at the interface of the glass plate and substrate since the plate and substrate have different compressibilities.

As generally known, when the surfaces of two glass plates are cleaned and brought into mutual contact, the coefficient of friction between them increases. As a result, the glass plates are bonded to each other. This bonding may be attributed to the fact that the alkali metal ions in either glass plate dissolves into the water-adsorbing surface region of the other glass plate. No silicon body has a water-adsorbing surface region, however. Therefore, it has been thought impossible to bond a single-crystal silicon plate to a glass substrate like a glass plate.

SUMMARY OF THE INVENTION

The object of the present invention is to provide a method of strongly bonding two single-crystal silicon bodies without using a bonding agent or without fusing these bodies.

According to the invention there is provided a method of bonding two single-crystal silicon bodies, which comprises the steps of: (i) mirror-polishing the contact surfaces of the bodies to reduce the surface roughness to 500Å or less; (ii) cleaning the mirror-polished surfaces to remove contaminant therefrom; and (iii) bringing the surfaces into mutual contact so that substantially no foreign substance can enter the gap between these surfaces.

The mirror-polishing may be optical polishing. If the contact surfaces of the bodies are not polished to reduce their roughness to 500Å or less, a strong bond can not be accomplished. The "surface roughness" is given in the maximum height (Rmax) defined by JIS B-0601 (1982).

After the surfaces of the bodies have been mirror-polished, contaminant, e.g., fine particles, adsorbed ions, organic material and inorganic material, is removed from these surfaces. This cleaning may be done by washing these surfaces with water or surfactant and/or by treating them with organic solvent or an acid solution. After the cleaning, the surfaces are dried, thus evaporating the water, solvent or acid solution.

These bodies may be placed in a clean room where 20 or less foreign substance particles are floating in every cubic meter, lest the foreign substance should enter the gap between the contact surfaces of the bodies.

The polished, cleaned surfaces of the bodies are brought into contact with each other. Heat may be applied to the bodies, whereby the bodies are firmly bonded. It is desired that the bodies be heated to 300° C. or more, preferably to 600°–1250° C.

The method described above makes it possible to strongly bond two single-crystal silicon bodies without using a bonding agent or fusing these bodies. The bodies bonded by this method can hardly be separated without being broken.

The method of the invention may be used in various fields of art. For instance, when it is applied to the manufacturing of a semiconductor pressure transducer, a single-crystal silicon plate with a diaphragm portion can be bonded to a silicon substrate of the same physical properties as the plate, without using a bonding agent. No problem will arise if the substrate has different physical features, i.e., the problems resulting from the difference in expansion coefficient or compressibility between the plate and substrate. Since no bonding agent is used to bond the bodies, no residual stress is created at the interface between these bodies. Hence, the method of the present invention serves to manufacture a semiconductor pressure transducer which can accurately detect the pressure applied to it.

The method according to the invention may be applied to the manufacturing of semiconductor devices other than a pressure transducer, which includes the step of bonding two single-crystal silicon layers of different conductivity types, thereby forming a pn junction, the step of bonding single-crystal silicon layers of different impurity concentrations, thereby forming a buried layer, or the step of forming a single-crystal layer to be used in place of an epitaxial layer.

BRIEF DESCRIPTION OF THE DRAWINGS

FIG. 1 is a cross sectional view of a known semiconductor pressure transducer; and FIG. 2 is a graph illustrating the relationship between the heat treatment temperature and fractural stress of the structure consisting of two single-crystal silicon bodies which has been made by a method according to the present invention.

DETAILED DESCRIPTION OF THE PREFERRED EMBODIMENT

One embodiment of the invention will be described in detail.

First, the contact surfaces of two single-crystal silicon bodies were subjected to optical polishing, thus reducing their roughness to 500A or less. The polished surfaces were then degreased with Tri-clene. Thereafter, both bodies were immersed in the mixture of sulfuric acid and hydrogen peroxide for two hours. They are washed with water, thereby removing contaminant, e.g., organic material or inorganic material, from the polished surfaces. The bodies were then immersed in methanol, thereby removing water from their surfaces. This done, freon gas was blown against the polished surfaces. As a result, the methanol was removed from these surfaces. The bodies thus cleaned were then placed in a clean room wherein about 20 foreign substance particles were present in every cubic meter. Pressure of about 3 $Kg/cm^2$ was applied on the bodies, thereby bonding them together. It was ascertained that the bodies were so firmly bonded that they could not be separated without breaking either body.

The following experiments were conducted to determine the criticalities of the steps of the method according to the invention.

In order to detect how the roughness of the contact surfaces of bodies influences the bonding, two single-crystal silicon bodies whose surface roughness was reduced to 250A or less by optical polishing were immersed in an acid aqueous solution containing hydrofluoric acid, nitric acid and acetic acid. The surface roughness then increased to 1000–1500A. This done, the bodies were washed in the same way as described above and then pressure of about 3 $Kg/cm^2$ was applied to them. Nonetheless, the bodies were not firmly bonded to each other. Further, two other single-crystal silicon bodies whose surface roughness was reduced to 250A or less by optical polishing were immersed in the same acid aqueous solution. Then, the surface roughness increased to approximately 500A. This done, the bodies were washed in the same way and then pressure of about 3 $Kg/cm^2$ was applied to them. The bodies were firmly bonded to each other. Obviously, both bodies cannot be firmly bonded unless the surface roughnesses of their contact surfaces is 500A or less.

Then, in order to detect how the contaminant existing at the interface between the bodies influences the bonding, two single-crystal silicon bodies with their contact surfaces already cleaned by the method described above were left in the atmosphere for about two hours. They were immersed in Tri-clene and then dried. This done, the surfaces of the bodies were brought into contact in the clean room. They could not be bonded at all. When one body was inclined, the other body slid down. This result may be attributed to the followings facts. First, the contact sufaces became dirty while they were left in the atmosphere. Second, the oil contained Tri-clene stuck to the surfaces. Further, various cleanings were applied to the contact surfaces of single-crystal silicon bodies in order to ascertain how the method of cleaning influences the bonding. Some methods proved desirable, and others did not.

Methods That Helped to Achieve Good Bonding (1) Samples were rubbed and washed with a neutral detergent. After this washing, they were immersed in a solution consisting of 3 parts of $H_2SO_4$ and 1 part of $H_2O_2$ for two hours. They were immersed in boiling aqua regia for one hour. Thereafter, they are washed with water and then dried.

(2) Samples were rubbed and washed with a neutral detergent. After this washing, they were washed with water and dried.

(3) Samples were immersed in hydrofluoric acid and then washed with water. They were immersed in a solution consisting of 3 parts of $H_2SO_4$ and 1 part of $H_2O_2$. Thereafter, they were washed with water and dried.

(4) Samples were oxidized in an oxidizing atmosphere at 1150° C., thereby forming oxide surface layers having a thickness of 5000A. The samples were immersed in a solution consisting of $H_2SO_4$ and $H_2SO_2$ and then in aqua regia. Thereafter, they were washed with water and dried.

Methods That Did Not Help to Achieve Good Bonding (5) Samples were immersed in a solution consisting of 3 parts of $H_2SO_4$ and 1 part of $H_2O_2$. They were then immersed in aqua regia. Thereafter, they were washed with water and dried. (Particles of foreign matter stuck to the surfaces of each sample.)

(6) Samples were rubbed and washed with a neutral detergent. After this washing, they were immersed in a solution consisting of 3 parts of $H_2SO_4$ and 1 part of $H_2O_2$ for two hours. The samples were immersed in boiling aqua regia for one hour. They are water-washed and then dried. The samples were immersed in acetone for one hour and dried. (The organic material contained in acetone seemed to stick to the surfaces of the samples.)

(7) Samples were washed with Tri-clene. They were immersed in acetone. Thereafter, the samples were washed with water and dried. (The oil film on the surfaces of the samples seemed to be not thoroughly removed.)

(8) Samples were immersed in acetone and were rubbed and washed. They were then water-washed and dried. (The oil film on the surfaces of the samples did not seem thoroughly removed.)

The two single-crystal silicon bodies which had been subjected to optical polishing and cleaned by method (1), (2), (3) or (4) could not be strongly bonded in the atmosphere. This is perhaps because the tiny particles of foreign matter floating in the air had entered into the gap between the bodies. It was found that the bodies could also be firmly bonded in a room wherein 100 or less foreign matter particles existed in every cubic meter, provided the bodies are put together quickly. Further, the bodies could be strongly bonded when placed in a room with a vacuum of $10^{-5}$ Torr, as in a clean room.

It may be predicted that the single-crystal silicon bodies were firmly bonded because oxide films were formed on their contact surfaces. These oxide films may have been formed during the mirror-polishing or during the cleaning. To ascertain this, single-crystal silicon bodies with mirror-polished surfaces were washed with water, immersed in a hydrofluoric acid-based liquid, thereby removing the oxide films from the surfaces, washed with acetone, dried with freon gas, and put together in the clean room. They were indeed bonded, but could be easily separated without breaking either of them.

The inventors thereof had found that two single-crystal silicon bodies bonded in the method described above would be more strongly bonded if heated. To prove this, they have conducted the following experiment. Many samples were prepared, each consisting of a first silicon plate (10×10×0.2 mm) with a hole having a diameter of 7 mm and a second silicon plate (10×10 mm) bonded to the first silicon plate in the method stated above. One of these samples was not heated at all, and the others were heated to various temperatures. Each sample was attached to a hydraulic system which applied pressure through the hole of the first siicon plate until the first and second silicon plates were separated. FIG. 2 shows the results of this test, i.e., the relationship between the temperature (°C.) to which the each sample was heated and the fractural stress ($Kg/cm^2$). As shown in FIG. 2, samples A, B and C which had not been heated, heated to 100° C. and heated to 150° C., respectively, remained intact until pressure of 2 to 2.5 $Kg/cm^2$ was applied. Sample D which had been heated to 200° C. remained intact until pressure of 7 $Kg/cm^2$ was applied. Samples E, F and G which had been heated to 300° C., 400° C. and 500° C., respectively, remained intact until pessures of 14 $Kg/cm^2$, 12.5 $Kg/cm^2$ and 17 $Kg/cm^2$ were applied to them.

FIG. 2 reveals that the bonding force greatly increased when the bonded single-crystal silicon bodies were heated to 300° C. or more.

As is known, silicon atoms, as well as univalent element atoms which most readily diffuse, diffuse at a negligibly low speed at about 300° C. It is also known that at about 300° C. most water particles adsorbed in the oxide film are liberated and the silanol (Si-OH) formed by the chemical adsorption of water is polymerized. It may therefore be predicted that the single-crystal silicon bodies were bonded not by mutual diffusion known as the mechanism of bonding metal bodies, but by the interaction between the hydrate layers formed on their contact surfaces and by the Si-O-Si structure formed as silanol condensation.

Therefore, the single-crystal silicon bodies may be strongly bonded if their contact surfaces are cleaned and if both bodies are heated to 300° C. or more after they have been put together. But the heat treatment does not help so much in raising the seal between the bodies. This was proven by the fact that no air leakage was found to occur in the vacuum of $10^{-9}$ Torr or less, even in a bonded structure made at room temperature, when the structure was tested by a helium-leak detector.

Using the method described above, the inventors hereof made a semiconductor pressure transducer. More specifically, an n-type [111] silicon substrate was polished on both major surfaces. A p-type diffusion resistive layer was formed on one major surface of this substrate. An aluminum film was vapor-deposited on the substrate on which the diffusion resistive layer was formed. The aluminum film was then patterned by photolithography, thereby forming a bridge circuit whose piezoelectric resistance gauge is that diffusion resistive layer. A PSG film was formed to protect the bridge circuit. Thereafter, the central portion of the substrate was etched, thus forming a diaphragm having a diameter of 8 mm and a thickness of 150 um. As a result, a pressure-sensitive pellet (10 mm×10 mm ×400 um) with that diaphragm was made. The maximum pressure that this pellet can measure was 4 $Kg/cm^2$.

As the base of the pressure transducer, a silicon disk having a diameter 16 mm and a thickness of 3 mm was used. A pressure-guiding hole having a diameter 4 mm was cut in the central portion of the silicon disk. One major surface of the disk was mirror-polished. After this polishing, the disk was immersed in a solution consisting of 3 parts sulfuric acic and one part 40% hydrogen peroxide aqueous solution for about one hour. Thereafter, the silicon disk and the pellet were water-washed and dried. They are then brought into contact without allowing dust to enter the gap between them. The washing, drying and contacting the disk and pellet were carried out in a clean room. The disk and pellet were bonded firmly, thus forming a bonded structure. This structure was placed in an oven and heated at 300° C. for one hour. As a result, the disk and pellet were more firmly bonded. Thus manufactured was a semiconductor pressure transducer.

The aluminum electrodes of the pressure transducer were examined. No defect or deterioration was found in them. The transducer was then tested to determine how its residual resistance varied with temperature in a vacuum, whether or not air leaked through the gap between the disk and pellet, and at what pressure the disk and pellet were separated. The transducer was found to have good characteristics. More precisely, its residual resistance changed 2% or less as the ambient temperature changed within the range of from $-30°$ C. to $+100°$ C., no air leak occurred in the vacuum of about $10^{-9}$ Torr or less, and the disk and pellet were separated at the pressure of 10 Kg/cm$^2$, more or less. The semiconductor pressure transducer was then put to an operation test. That is, the ambient pressure was raised from 1 atmosphere to 140 Kg/cm$^2$ (hydrostatic pressure). The result was that the equilibrium point of the bridge circuit did not change. This shows that the interface between the disk and pellet did not adversely influence the diaphragm.

Another semiconductor pressure transducer was made, identical with the transducer described above but its base was a borosilicate glass disk. Its pressure-sensitive pellet and disk were bonded as strongly as those of the above-mentioned transducer. However, the equilibrium point of its bridge circuit changed about 10% as the ambient pressure was varied from 1 atmosphere to 140 Kg/cm$^2$ (hydrostatic pressure). This reveals that the interface between the borosilicate disk and pellet adversely influenced the diaphragm.

What is claimed is:

1. A method of bonding two single-crystal silicon bodies together at a temperature of below 300° C. without fusing of the bodies or application of an electrical field thereto comprising the steps of:
    mirror-polishing surfaces of the bodies to reduce the surface roughness to 500 A or less;
    cleaning the mirror-polished surfaces with liquid cleaning agents to remove organic and inorganic contaminant therefrom;
    drying the surfaces to remove residual cleaning agent, thereby producing clean surfaces, while maintaining the surface roughness of such surfaces at 500 A or less bringing the clean surfaces having a surface roughness of 500 A or less together at a temperature of below 300° C. to acheive mutual contact while insuring that substantially foreign substance enters the gap between these surfaces, to thereby bond the two single-crystal bodies together.

2. The method according to claim 1, wherein said mirror polishing is optical polishing.

3. The method according to claim 1, wherein said cleaning is at least one of the process group consisting of water-washing, treatment with a surfactant, treatment with an organic solvent and treatment with an acid solution.

4. The method according to claim 1, wherein said step of bringing the surfaces of the bodies into mutual contact is carried out in a clean room wherein 20 or less foreign particles exist in every cubic meter.

5. The method according to claim 1, further comprising the step of heating the bonded structure formed by bringing the surfaces of the bodies into mutual contact.

6. The method according to claim 5, wherein said heating step is to heat the bodies to at least 300° C.

7. The method according to claim 6, wherein said bodies are heated to 600 to 1250° C.

8. The method according to claim 1, wherein a step of forming thermal oxide layers on the mirror-polished surfaces of the bodies is further included before bringing the surfaces into mutual contact.

* * * * *

UNITED STATES PATENT AND TRADEMARK OFFICE
CERTIFICATE OF CORRECTION

PATENT NO. : 4,671,846

DATED : June 9, 1987

INVENTOR(S) : MASARU SHIMBO ET AL

It is certified that error appears in the above-identified patent and that said Letters Patent is hereby corrected as shown below:

Col. 8, line 14, after "substantially" and before "foreign", insert --no--.

Signed and Sealed this

Seventeenth Day of May, 1988

Attest:

DONALD J. QUIGG

*Attesting Officer*     *Commissioner of Patents and Trademarks*